United States Patent
Weishauss et al.

(10) Patent No.: US 6,555,447 B2
(45) Date of Patent: *Apr. 29, 2003

(54) METHOD FOR LASER SCRIBING OF WAFERS

(75) Inventors: Ilan Weishauss, Kiriat Bialik (IL); Ran Manor, Haifa (IL); Oded Wertheim, Kiriat Bialik (IL)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/817,959

(22) Filed: Mar. 27, 2001

(65) Prior Publication Data

US 2001/0054606 A1 Dec. 27, 2001

Related U.S. Application Data

(63) Continuation-in-part of application No. 09/327,722, filed on Jun. 8, 1999, now abandoned.

(51) Int. Cl.⁷ .............................................. H01L 21/78
(52) U.S. Cl. ...................................................... 438/460
(58) Field of Search ................................. 438/460, 461, 438/462, 465

(56) References Cited

U.S. PATENT DOCUMENTS

| | | |
|---|---|---|
| 4,399,345 A | 8/1983 | Lapham et al. |
| 4,543,464 A | 9/1985 | Takeuchi |
| 4,716,270 A | 12/1987 | Gnanamuthu et al. |
| 4,861,964 A | 8/1989 | Sinohara |
| 4,865,686 A | 9/1989 | Sinohara |
| 5,151,389 A | 9/1992 | Zapella |
| 5,185,295 A | 2/1993 | Goto et al. |
| 5,552,345 A * | 9/1996 | Schrantz ................. 438/460 |
| 5,922,224 A | 7/1999 | Broekroelofs |
| 5,922,464 A | 7/1999 | Broekroelofs |
| 5,968,382 A | 10/1999 | Matsumoto et al. |
| 6,257,224 B1 * | 7/2001 | Yoshino et al. ........ 125/13.01 |

FOREIGN PATENT DOCUMENTS

| | | |
|---|---|---|
| EP | 0 818 818 A | 1/1998 |
| JP | 53033050 | 3/1978 |
| JP | 56049539 | 5/1981 |
| JP | 58036939 | 3/1983 |
| JP | 5814553 | 8/1983 |
| JP | 60167351 | 8/1985 |
| JP | 10321908 | 12/1998 |
| WO | WO 00/75983 | 12/2000 |

OTHER PUBLICATIONS

International Search Report, application No. PCT/US 02/14471 dated Aug. 8, 2002.

International Search Report of PCT/US0015530, filed Jun. 5, 2000.

* cited by examiner

Primary Examiner—David Nelms
Assistant Examiner—Thao P Le
(74) Attorney, Agent, or Firm—RatnerPrestia (57) ABSTRACT

A method for laser scribing a semiconductor substrate with coatings on top. The method comprises the steps of focusing a laser beam on a top surface of the substrate coating; absorbing energy from the laser into the coating layer; forming a first set of scribe lines in a first direction on the substrate by scanning the laser beam across the surface of the substrate to evaporate portions of the coating layer; and forming a second set of scribe lines in a second direction on the surface of the substrate substantially orthogonal to the first set of scribe lines to evaporate portions of the layer.

24 Claims, 7 Drawing Sheets

(Prior Art)

10 [w] treated

METHOD FOR LASER SCRIBING OF WAFERS

This application is a Continuation-in-Part of pending application Ser. No. 09/327,722 filed on Jun. 8, 1999, now abandoned.

FIELD OF THE INVENTION

This invention relates generally to dicing of semiconductor wafers. More specifically, the present invention relates to a method for laser scribing semiconductor wafers prior to mechanical dicing of the semiconductor wafer.

BACKGROUND OF THE INVENTION

Die separation, or dicing, by sawing is the process of cutting a microelectronic substrate into its individual circuit die with a rotating circular abrasive saw blade. This process has proven to be the most efficient and economical method in use today. It provides versatility in selection of depth and width (kerf) of cut, as well as selection of surface finish, and can be used to saw either partially or completely through a wafer or substrate.

Wafer dicing technology has progressed rapidly, and dicing is now a mandatory procedure in most front-end semiconductor packaging operations. It is used extensively for separation of die on silicon integrated circuit wafers.

Increasing use of microelectronic technology in microwave and hybrid circuits, memories, computers, defense and medical electronics has created an array of new and difficult problems for the industry. More expensive and exotic materials, such as sapphire, garnet, alumina, ceramic, glass, quartz, ferrite, and other hard, brittle substrates, are being used. They are often combined to produce multiple layers of dissimilar materials, thus adding further to the dicing problems. The high cost of these substrates, together with the value of the circuits fabricated on them, makes it difficult to accept anything less than high yield at the die-separation phase.

Dicing is the mechanical process of machining with abrasive particles. It is assumed that this process mechanism is similar to creep grinding. As such, a similarity may be found in material removal behavior between dicing and grinding. The size of the dicing blades used for die separation, however, makes the process unique. Typically, the blade thickness ranges from 0.6 mils to 50 mils (0.015 mm to 1.27 mm), and diamond particles (the hardest known material) are used as the abrasive material ingredient. Dicing saw blades are made in the form of an annular disc that is either clamped between the flanges of a hub or built on a hub that accurately positions the thin flexible saw blade. Because of the diamond dicing blade's extreme fineness, compliance with a strict set of parameters is imperative, and even the slightest deviation from the norm could result in complete failure.

Figure 1:
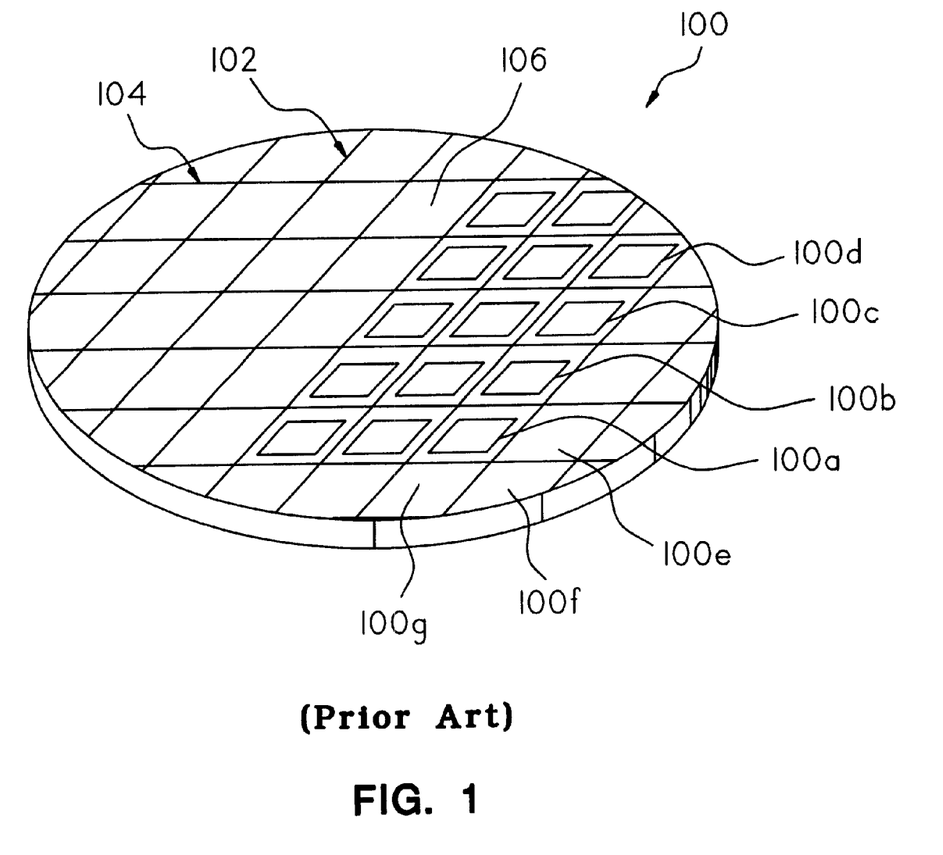
FIG. 1 is an isometric view of a semiconductor wafer used to form semiconductor devices.

FIG. 1 is an isometric view of a semiconductor wafer 100 during the fabrication of semiconductor devices. A conventional semiconductor wafer 100 may have a plurality of chips, or dies, 100a, 100b, . . . formed on its top surface. In order to separate the chips 100a, 100b, . . . from one another and the wafer 100, a series of orthogonal lines or "streets" 102, 104 are cut into the wafer 100. This process is also known as dicing the wafer.

Figure 4:
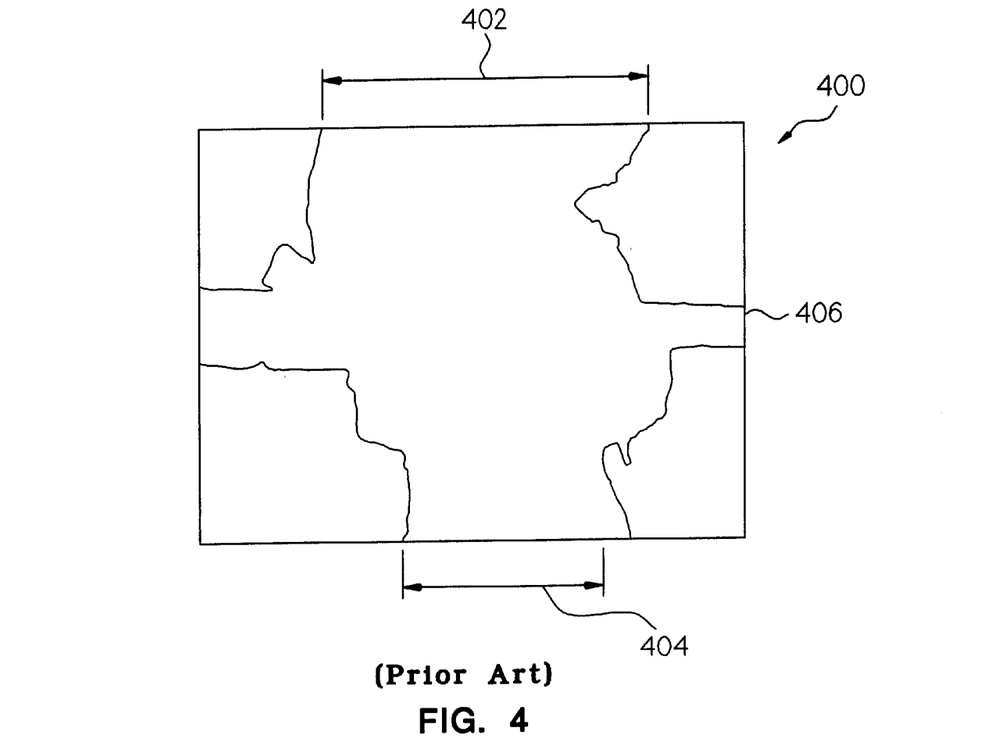
FIG. 4 is an illustration of backside chipping of a substrate after dicing using conventional single blade techniques.

IC wafers are coated with various layers such as passivation of oxides or nitrides, dielectrics, polymer coatings, and aluminum as well as copper metal pads (all collectively shown as 106 in FIG. 1). The wafer scribe lines (streets) reflect similar coatings on the chips, since all of the test devices and alignment marks are located within the scribe line borders. The wafer streets are therefore fully or partially coated with different materials and are largely non-homogeneous. This combination of materials has a significant effect on wafer dicing and die edge quality. As shown in FIG. 4, when conventional dicing technology is used, such as a single blade and a single cut, the die edge on the bottom side of semiconductor wafer 400 suffers severe backside chipping (BSC) 406. In addition, on the topside of the wafer 400, problems at the die edge include cracking of the passivation and dielectric layers (not shown), the smearing or tearing of the metal pads (not shown), and the formation of polymer slivers (not shown).

One approach to overcome the aforementioned die edge problems is a mechanical dual dicing method. This method is a combination of two cuts (step cut), the first one being shallow and the second one being a through cut. The purpose of the first cut is to remove all the coatings 106 from the streets 102, 104 of semiconductor wafer 100 in order to permit a smooth through cut. The first cut, is performed using either a beveled blade or a standard blade that penetrates the silicon wafer as well. The removal of the coatings, passivation, dielectrics and metal pads 106 from the streets 102, 104 also affects the backside chipping. As a result, the size of chipping is reduced.

There are many disadvantages, however, to the step cut. First, the process throughput is reduced dramatically, since instead of one pass in the street, two passes are required. Second, the mechanical removal of the coatings creates residual cracks, which, in turn, cause further deterioration of the dice. Third, when the bevel blade wears out, the kerf gets wider and this requires frequent handling and replacement of the blade. Forth, the price of bevel blades is more expensive by a factor of five compared to a standard blade. All these drawbacks result in a high cost of ownership with regard to the step cut process.

There are other disadvantages regarding the beveled cut. Namely, blade penetration height must be carefully monitored, because for each one micron of penetration, the kerf widens by about two microns. In addition, the beveled blade may insert hidden damage into the die edge, in the form of cracks for example. Visual inspection of dice after dicing (an industry standard) is not capable of detecting this damage.

In view of the shortcomings of the prior art, there is a need to develop a method to cut die having various coating layers and test structures in the wafer scribe lane so as to increase throughput, minimize the backside chipping, and to increase the yield of useable circuits.

SUMMARY OF THE INVENTION

In view of the shortcomings of the prior art, it is an object of the present invention to optimize the dicing process and minimize bottom side chipping (BSC) of semiconductor wafers.

The present invention is a method for dicing a semiconductor substrate by focusing a laser beam on a top surface of the substrate; absorbing energy into only the layer; and forming scribe lines on the substrate by scanning the laser beam across the surface of the substrate to evaporate only portions of the layer.

According to another aspect of the invention, the substrate is diced with a dicing saw after the substrate is scribed.

According to still another aspect of the invention, the scribe line removes all the layers over the silicon wafer, with minimal heat damage to the silicon substrate.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION

In the manufacture of semiconductor devices, individual chips are cut from a large wafer using a very high speed rotating saw blade. In essence, the saw blade grinds away a portion of the wafer along linear streets or kerfs (102, 104 as shown in FIG. 1) in one direction followed by a similar second operation in an orthogonal direction.

The quality of the dice (chips) is directly related to the minimization of chipping during the dicing operation. The inventors have determined that by removing all the layers on top of the silicon substrate using a non-mechanical approach, in the area where the substrate will be cut through, throughput is dramatically increased (by about a factor of two), BSC is minimized, and device yield is increased as well.

Figure 2:
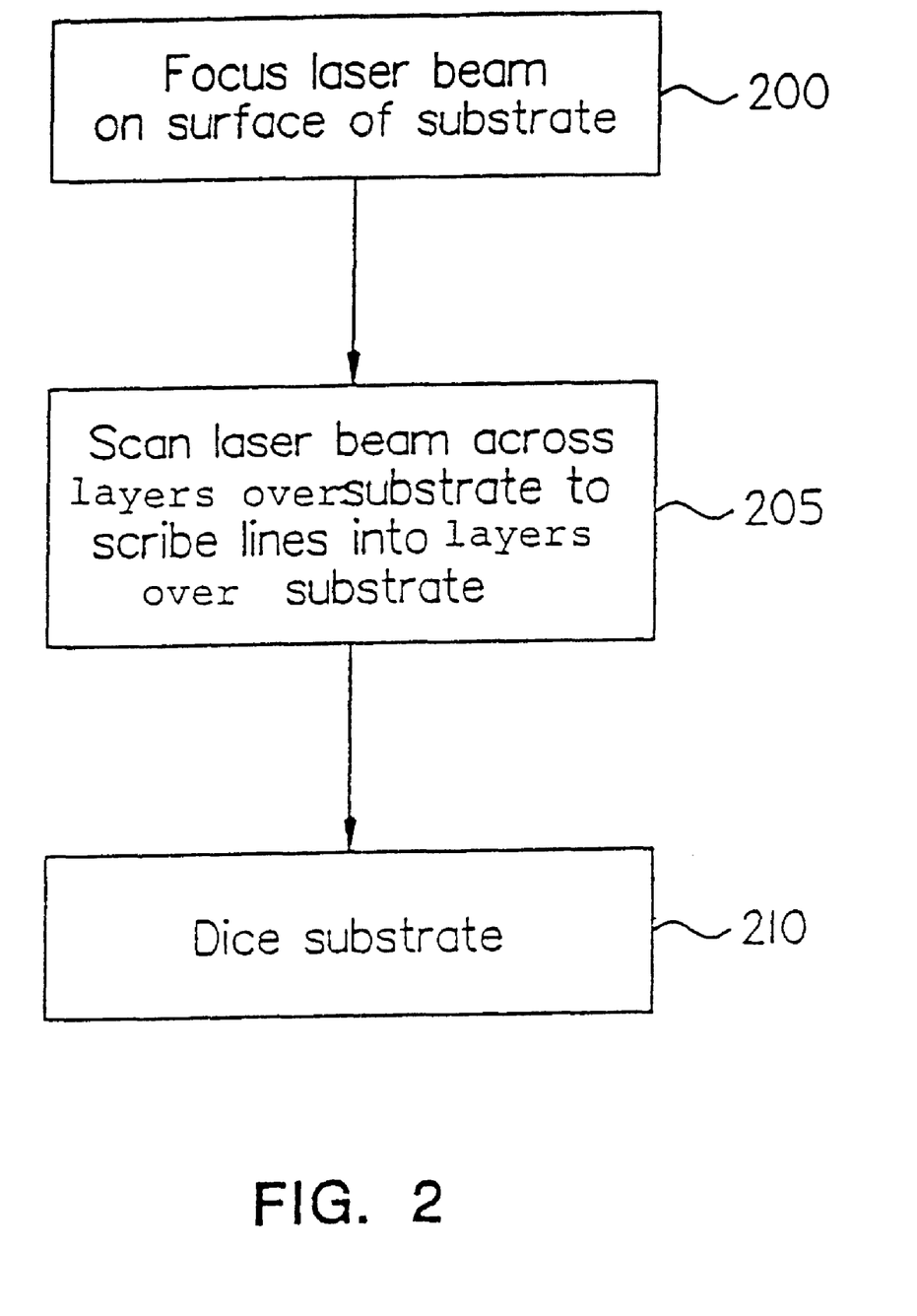
FIG. 2 is a flow chart of an exemplary method of the present invention.
Figure 3:
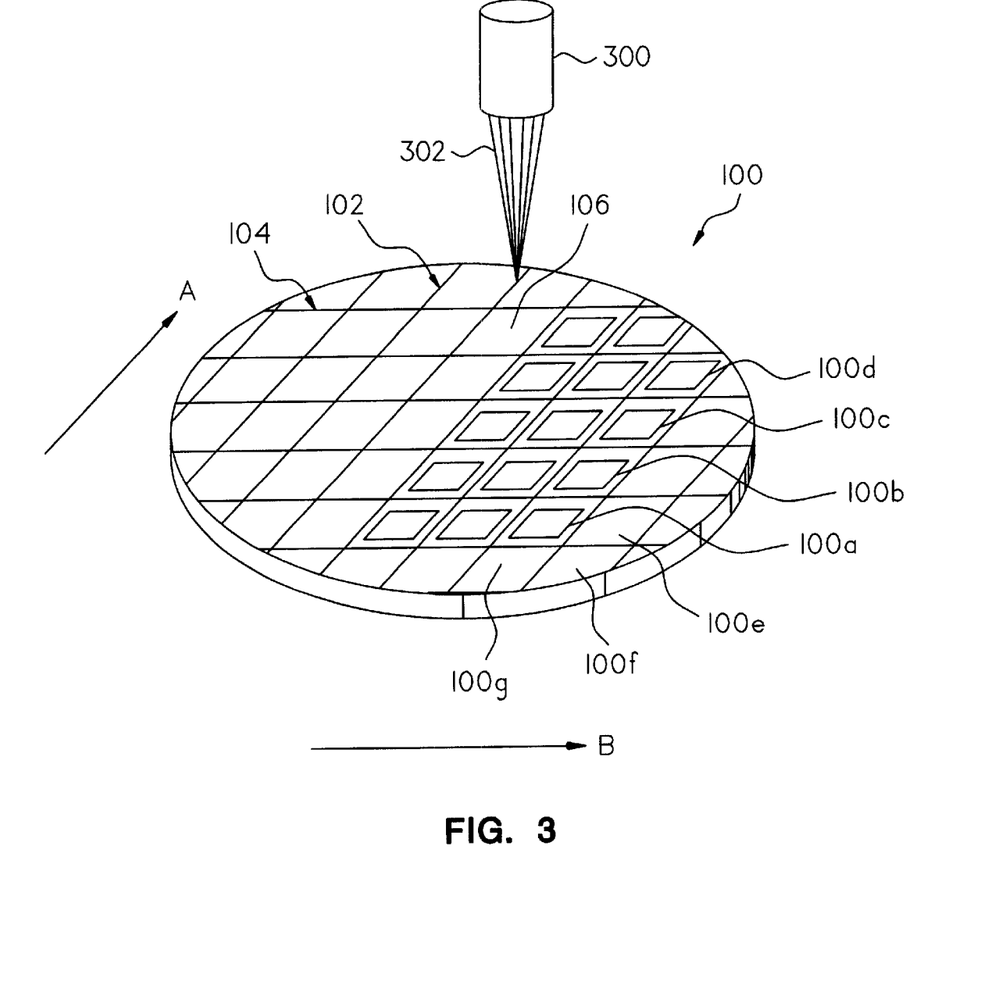
FIG. 3 is a diagram of an exemplary embodiment of the present invention.

Referring to FIG. 2, a flow chart of an exemplary embodiment of the present invention is shown. Referring to FIG. 3, the exemplary laser scribing principle is shown.

In FIG. 2, at Step 200, the laser beam 302 from laser 300 (shown in FIG. 3) is focused on the surface of the substrate 100. It should be noted that the laser beam 302 might also be focused at a point above or below the surface of substrate 100. At Step 205, the laser beam 302 is scanned across the surface of the substrate coating layers 106 to remove all layers 106 by evaporation and form desired scribe lines 102.

The upper layers on top of the wafer surface are a combination of passivation layers, dielectrics, oxides, nitrides and metal pads. In most standard ICs, the total thickness of all these layers is usually less than 20 microns. The individual thickness of each layer is usually less than one micron, with the exception of the polymer layer having a thickness of few microns. The optical properties, such as absorption, reflection, and index of refraction of these layers are very different from one layer to another and from that of the silicon substrate.

One of the major concerns when processing IC wafers with laser irradiation is the high sensitivity of the device to heating and thermal damage. Excessive heating of the substrate can reduce device performance, reliability and even cause instant device failure. It is therefore necessary to use an appropriate range of laser frequencies that are strongly absorbed in the upper layers, but with minimal absorption within the substrate. One of the most suitable lasers for the suggested process in this embodiment is the $CO_2$ laser irradiating in the far infrared region of the spectrum at a wavelength of about 10.6 microns, for example. The absorption coefficient of the $CO_2$ laser energy by silicon is practically zero, and is considerably lower (by about an order of magnitude, i.e. a factor of 10, and preferably at least an order of magnitude) than the absorption coefficient of the coating layers. On the contrary, silicon heavily absorbs (absorption coefficient of $10^6$ $cm^{-1}$) energy in the UV range of the spectrum, such as 200 nm. Laser energy sources, such as Excimer (UV) laser sources, described in the prior art to process silicon (U.S. Pat. No. 5,151,389 to Zappella, and U.S. Pat. No. 5,552,345, Schrantz et al.) are examples of sources whose energy is readily absorbed by silicon. Nevertheless, the use of lasers emitting energy in the UV frequency range can significantly damage the silicon wafer, while the present embodiment overcomes this major deficiency by using laser radiation that is not absorbed by the silicon substrate. The silicon cannot be heated directly by far infrared laser radiation, while the upper coatings over the silicon substrate are partially or completely removed by the $CO_2$ laser beam due to the much larger absorption coefficient of the layers relative to that of the silicon substrate. A similar approach is being used in the well known process of etching, where a stop etch layer is used to increase process robustness, accuracy, and to protect other layers. In the aforementioned embodiment, the silicon substrate acts as a stop etch layer for the laser irradiation. In U.S. Pat. No. 4,716,270 to Gnanamuthu et al. totally different physics are used to differentiate between laser processing of two layers of material. In Gnanamuthu et al. the workpiece is a metal coated with an organic polymer, and the differentiation between the laser processing on the two layers is based on a reflection principle, in which the laser radiation is highly reflected from the underlying metal substrate. By contrast, the exemplary embodiment of the present invention is capable of removing thin metal layers on top of the wafer substrate, despite their high reflectivity to the laser radiation. This is possible because the exemplary process is based on absorption of the laser energy rather than reflection.

In an exemplary embodiment of the present invention, the laser beam 302 is about 50 $\mu$m in diameter, although other diameters may be used as necessary. The laser beam diameter should preferably be larger than the thickness of the dicing blade, however, in order to eliminate completely any front side chipping of the wafer. In forming streets 102, 104 the laser beam 302 removes only the layers on top of the silicon substrate resulting in minimal indirect heating of the silicon substrate. Complementary to the laser scribing process is the mechanical saw dicing of the silicon substrate where dies are singulated.

In an exemplary embodiment, the laser 300 is stationary while the substrate 100 is moved in direction A, for example, using a conventional X–Y table (not shown) onto which the substrate 100 is mounted, to form streets 102. As each street 102 is completed, substrate 100 is translated in direction B by the X–Y table and the process is repeated for an additional street 102.

After all of the streets 102 are formed, the substrate 100 is rotated by about 90° so that the process may be repeated to form streets 104 in substrate 100. Alternatively, the laser 300 may be moved relative to a stationary substrate 100 in either or both the X and Y directions.

At Step 210, the substrate is diced using conventional methods, such as a dicing saw; along the streets 102, 104 to form dies 100a, 100b, etc.

One major advantage of laser scribing is that laser scribing may be performed at a much higher feed rate than the conventional step cut dicing process to remove the top layers over the substrate. It should be noted, however, that the feed rates of the abrasive dicing, which follows the laser scribing, and the scribing are not necessarily the same. For example, scribing velocities can reach up to 600 mm/sec, which is about an order of magnitude greater than a conventional feed rate used in the dicing process.

Other advantages of the laser scribing over the bevel cut are 1) eliminating the need for expensive blades, and 2) allowing the possibility of sealing the passivation layer, thereby avoiding crack formation.

Figure 5:
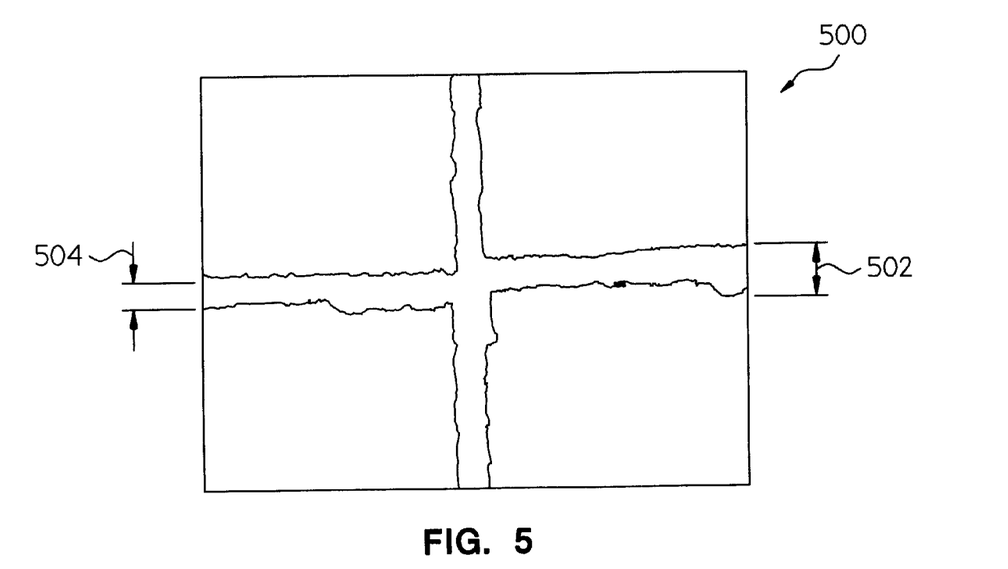
FIG. 5 is an illustration of backside chipping of a substrate after dicing according to a first exemplary embodiment of the present invention.

In a first exemplary method a wafer (substrate) was treated with a $CO_2$ laser beam to remove all of the coatings from the streets of the wafer (without any effect on the silicon substrate) prior to cutting, in order to decrease BSC. The wafer was treated with a uniform level of energy to remove the coatings over the substrate by evaporation. All the streets 102, 104 were treated according to the same parameters. The parameters of the $CO_2$ laser were as follows:
Power=15 Watts.
Speed=~2"/sec (~51 mm/sec)
Following laser scribing, the wafer was diced on a conventional dicing apparatus using the following parameters:
Feed rate: 2"/sec (50.8 mm/sec),
Spindle speed: 30,000 rpm,
Blade type: 2"(50.8 mm) diameter, nickel binder, approximately 0.0012 in. (0.030 mm) thick.
water flow:
main 1.5 L/min,
cleaning 1 L/min,
spray bar 1 L/min,
The wafer was subjected to microscopic analysis to determine the amount of BSC resulting from the dicing operation. FIG. 5 is a magnified view 500 of the BSC result where the upper layers are evaporated from the street according to the first exemplary embodiment before dicing the substrate. As shown in FIG. 5, the maximum BSC 502 is about 60 $\mu$m and the average BSC 504 is about 22 $\mu$m.

By contrast, FIG. 4 is a magnified view 400 of the BSC result where the upper coatings were not removed before dicing the substrate. As shown in FIG. 4, the maximum BSC 402 is about 165 $\mu$m and the average BSC 404 is about 100 $\mu$m.

In a second exemplary embodiment, two wafers were mounted on NITTO tape. Only one of the wafers was treated by the $CO_2$ laser beam to remove the coating from the streets of the wafer prior to cutting. The wafer was treated with a uniform level of energy to remove the coatings over the substrate. Each wafer street was treated according to the same parameters.

The parameters of the $CO_2$ laser were as follows:
Power=15 Watts
Feed rate=2.5"/sec (63.5 mm/sec)
Following laser scribing, the wafer was diced on a conventional dicing apparatus using the following parameters:
rate: 2"/sec (50.8 mm/sec),
Spindle speed: 30,000 rpm,
Blade type: 2"(50.8 mm) diameter, nickel binder, approximately 0.0012 in. (0.030 mm) thick.
water flow:
main 1.5 L/min,
cleaning 1 L/min,
spray bar 1 L/min,
Although specific spindle speeds are illustrated, it is contemplated that the spindle speed may be at least 2,000 RPM and may be as high as 60,000 RPM. Furthermore, instead of a $CO_2$ laser, other wavelengths of laser irradiation may be used such that their absorption coefficient within the coating layers 106 is significantly higher (by about at least an order of magnitude based on the wavelength of the laser) than that of the substrate. Use of these different lasers may produce varying degrees of BSC improvement. It is contemplated that lasers having wavelengths between about 1.2 and 15 microns may be used, preferably between about 9 and 11 microns, and most preferably about 9.3, 9.6 or 10.6 microns.

The laser is used primarily to remove various surface coatings, without damaging the edges of the scribe line. The improved BSC results from the removal of all the coating layers that typically clog the blade resulting in excessive backside chipping.

The wafer was then subjected to microscopic analysis to determine the amount of BSC resulting from the dicing operation.

Table I illustrates the BSC chipping results of the above test:

TABLE I

| Channel | | 1 | 1 | 1 | 1 | | 2 | 2 | 2 | 2 | | Total |
| Line # | | 1 | 2 | 3 | 4 | AVG | 5 | 6 | 7 | 8 | AVG | average |
| --- | --- | --- | --- | --- | --- | --- | --- | --- | --- | --- | --- | --- |
| Coating treated by laser scribing | Mean | 29 | 19 | 17 | 11 | 19 | 30 | 18 | 24 | 25 | 24 | 21.5 |
| | Max | 69 | 41 | 37 | 34 | 45 | 59 | 42 | 47 | 57 | 51 | 48 |
| Coating not treated by laser scribing | Mean | 67 | 79 | 64 | 80 | 73 | 45 | 44 | 40 | 43 | 43 | 58 |
| | Max | 170 | 178 | 134 | 205 | 172 | 156 | 143 | 119 | 116 | 134 | 153 |

Figure 6:
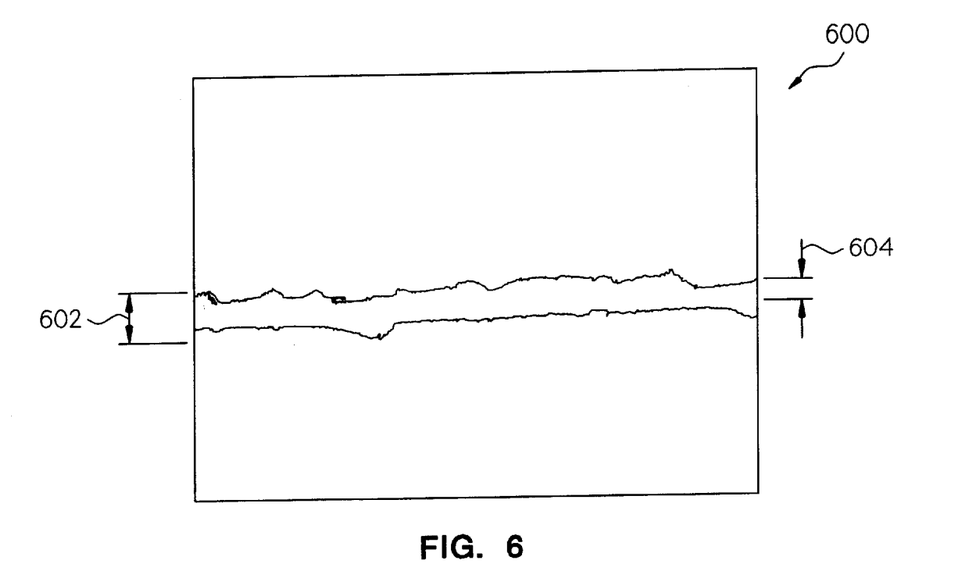
FIG. 6 is another illustration of backside chipping of a substrate after dicing according to an exemplary embodiment of the present invention.
Figure 7:
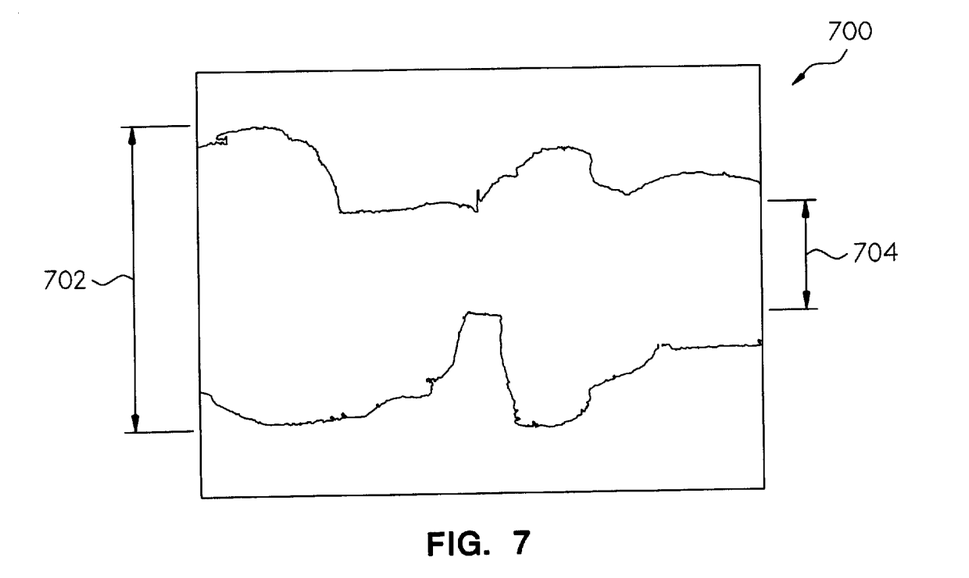
FIG. 7 is an illustration of backside chipping of an untreated substrate after dicing.

As shown in Table I, and illustrated in FIGS. 6 and 7, the removal of the coating by the $CO_2$ laser improves the BSC results, from 153 μm max (702 in FIG. 7) and 58 μm average (704 in FIG. 7) BSC to 48 μm max (602 in FIG. 6) and 21.5 μm average (604 in FIG. 6).

In a further test, seven wafers were mounted on NITTO tape and treated with the $CO_2$ laser beam. The 7 wafers were divided to 3 groups, two groups of 3 wafers each, were used to compare between two levels of laser beam energy, and one group of 1 wafer, was used as a reference for standard dicing. The wafers were treated with a uniform level of energy to remove the coatings as above.

The wafer streets were first treated with a $CO_2$ laser according to the following parameters:

| Group #1 | Group #2 |
| --- | --- |
| Power = 10 Watts. | Power = 15 Watts. |
| Feed rate = 13"/sec (330.2 mm/sec) | Feed rate = 13"/sec (330.2 mm/sec) |

Following the laser treatment, all of the wafers were then diced (through cut) on a conventional dicing machine using the following parameters:

Feed rate: 2.5"/sec (63.5 mm/sec),

Spindle speed: 30,000 rpm,

Blade type: 2"(50.8 mm) diameter, nickel binder, approximately 0.0014 in. (0.0356 mm) thick.

water flow:
   main 1.5 L/min,
   cleaning 1 L/min,
   spray bar 1 L/min,

The wafer was subjected to microscopic analysis to determine the amount of BSC resulting from the dicing operation.

Table II illustrates the BSC chipping results of the above test:

TABLE II

| Test # | Line # | Reference Max | Reference Avg. | Laser treated 10[w] max | Laser treated 10[w] Avg. | Laser treated 15[w] max | Laser treated 15[w] Avg. |
| --- | --- | --- | --- | --- | --- | --- | --- |
| 1 | 1 | 116 | 52 | 77 | 35 | 43 | 25 |
| 1 | 2 | 59 | 45 | 50 | 29 | 65 | 27 |
| 1 | 3 | 116 | 56 | 65 | 34 | 53 | 35 |
| 1 | 4 | 92 | 52 | 54 | 32 | 56 | 37 |
| 1 | 5 | 106 | 50 | 52 | 27 | 82 | 45 |
| mean per wafer: | | 97.8 | 51 | 59.6 | 31.4 | 59.8 | 33.8 |
| 2 | 1 | | | 39 | 23 | 88 | 41 |
| 2 | 2 | | | 60 | 30 | 60 | 31 |
| 2 | 3 | | | 57 | 37 | 42 | 20 |
| 2 | 4 | | | 47 | 29 | 60 | 45 |
| 2 | 5 | | | 54 | 38 | 52 | 34 |
| mean per wafer: | | | | 51.4 | 31.4 | 60.4 | 34.2 |
| 3 | 1 | | | 39 | 21 | 60 | 25 |
| 3 | 2 | | | 50 | 27 | 57 | 37 |
| 3 | 3 | | | 56 | 31 | 60 | 33 |
| 3 | 4 | | | 75 | 45 | 52 | 32 |
| 3 | 5 | | | 52 | 31 | 49 | 27 |
| mean per wafer: | | | | 54.4 | 31 | 55.6 | 30.8 |
| Mean | | 97.8 | 51 | 55.1 | 31.2 | 58.6 | 32.9 |
| standard deviation: | | 23.8 | 4 | 10.9 | 6 | 12.5 | 7.4 |

Figure 8:
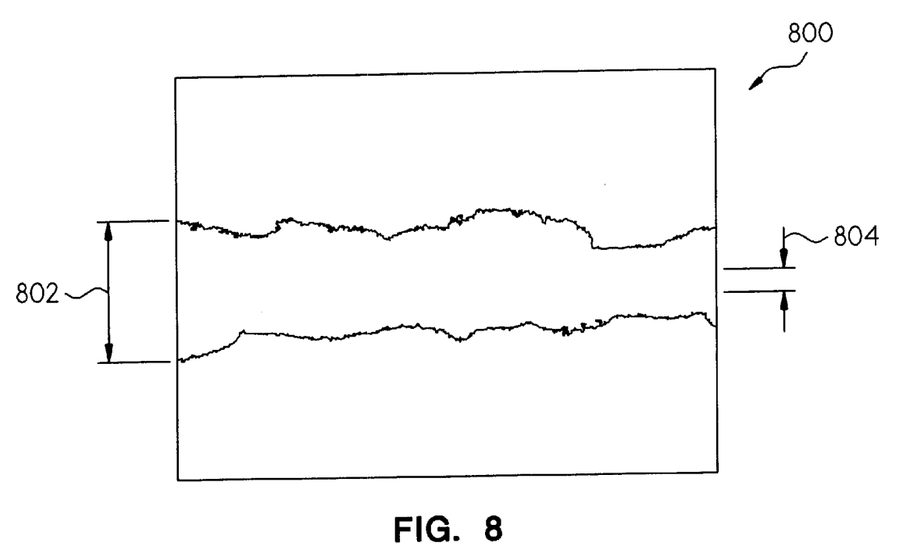
FIG. 8 is another illustration of backside chipping of an untreated substrate after dicing.
Figure 9:
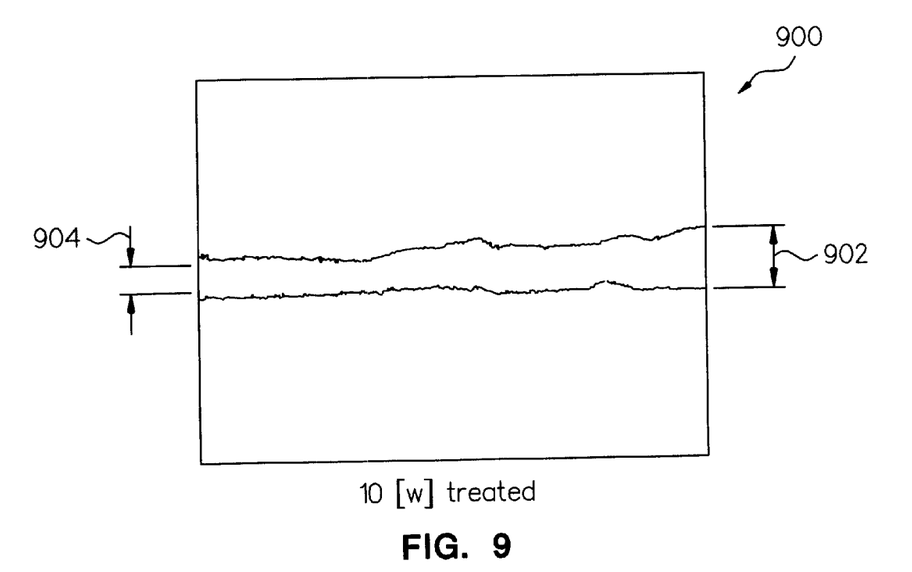
FIG. 9 is an illustration of backside chipping of a substrate after dicing according to a further exemplary embodiment of the present invention.
Figure 10:
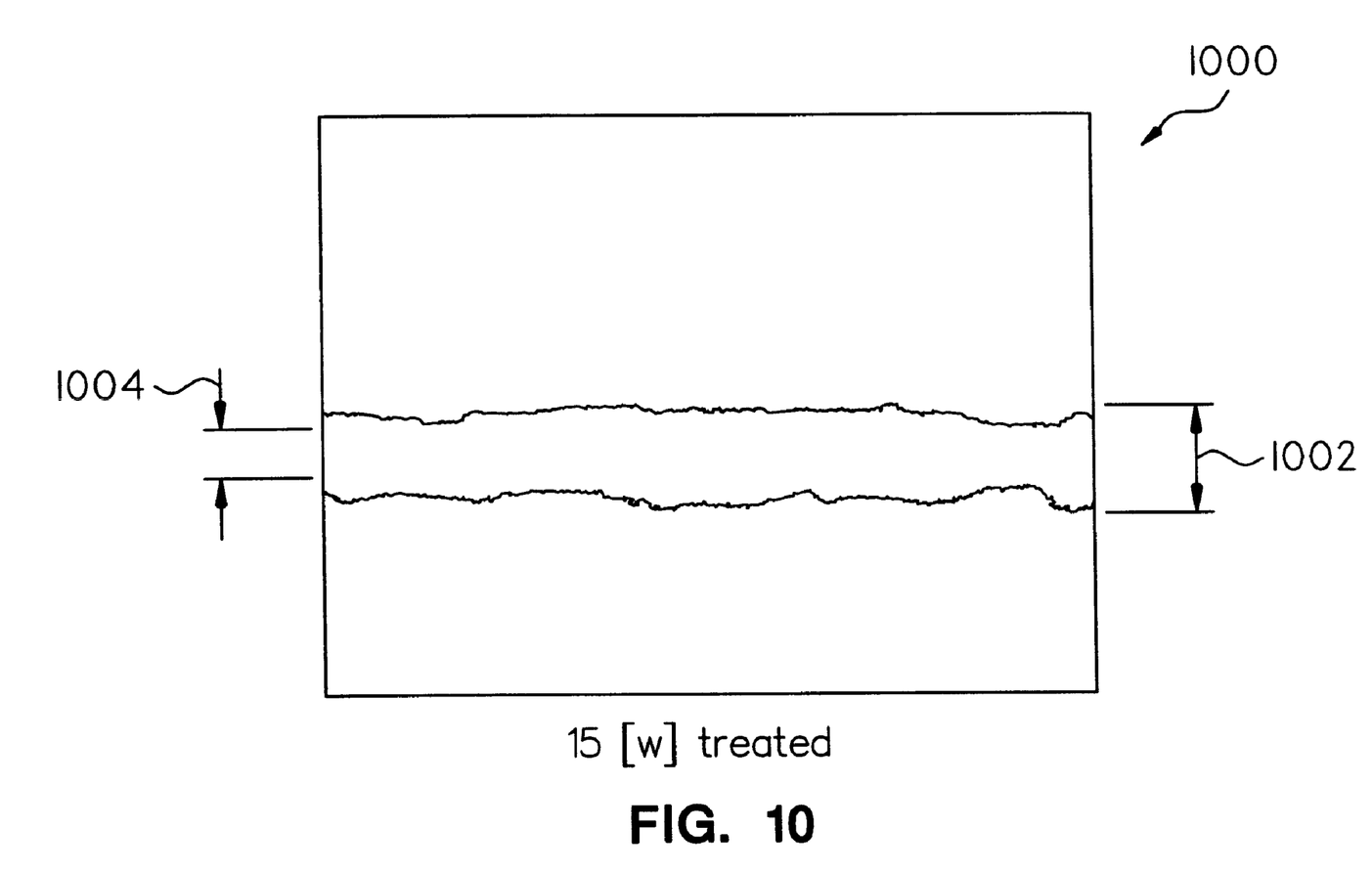
FIG. 10 is an illustration of backside chipping of a substrate after dicing according to yet another exemplary embodiment of the present invention.

As shown in Table II and illustrated in FIGS. 8–10, the BSC results on two wafer groups that were treated by the $CO_2$ laser beam are low compared to the results on the non treated wafer (the reference wafer). FIG. 8 is a bottom view 800 of reference wafer. FIG. 9 is the bottom view 900 of the wafer treated with a 10-Watt laser and FIG. 10 is the bottom view 1000 of the wafer treated with a 15-Watt laser.

As shown in FIG. 8, the BSC is 97.8 μm max (802 in FIG. 8) and 51 μm average (804 in FIG. 8). As shown in FIG. 9, using a 10 Watt $CO_2$ laser to evaporate all the upper coatings improves the BSC results to 55.1 μm max (902 in FIG. 9) and 31.2 μm average (904 in FIG. 9). Furthermore, as shown in FIG. 10, using a 15 Watt $CO_2$ laser to evaporate the coatings improves the BSC results to 58.6 μm max (1002 in FIG. 9) and 32.9 μm average (1004 in FIG. 10). On one hand, the results are repeatable in these experiments, as seen from the standard deviation calculated for each group, but on the other hand the results are not equal to the results obtained by using of the same parameters in the second experiment.

Overall, the BSC improvement achieved using the exemplary embodiment is between approximately 40% and 70% over the results achieved using single blade conventional methods.

Although lasers with specific power ratings are illustrated above, it is contemplated that lower or higher powered lasers may be used as desired. For example, it is contemplated that lasers having power rating as low as 2 Watts may be used to achieve reduced BSC.

Furthermore, rather that scribing the entire surface of the substrate before sawing, it is contemplated that as each scribe line is formed a dicing saw may be used to saw along that scribe line. Subsequent scribe lines may then be formed and sawed in sequence in the first direction across the surface of the substrate followed by a similar procedure along the second direction of the substrate to form the dice.

Although the invention has been described with reference to exemplary embodiments, it is not limited thereto. Rather, the appended claims should be construed to include other variants and embodiments of the invention, which may be made by those skilled in the art without departing from the true spirit and scope of the present invention.

What is claimed:

1. A method for dicing a semiconductor substrate comprising the steps of:

(a) aiming a laser beam at a layer placed over a top surface of the substrate, the layer having a first absorption coefficient relative to a wavelength of the laser beam;

(b) absorbing energy from the laser beam into the layer based on the first absorption coefficient;

(c) forming at first set of scribe lines in a first direction in the layer by scanning the laser beam across the layer, the laser beam removing at least a portion of the layer; and (d) forming a second set of scribe lines in a second direction in the layer by scanning the laser beam across the layer and removing at least a portion of the layer with the laser beam, the second direction substantially orthogonal to the first direction, wherein the substrate has a second absorption coefficient relative to the wavelength of the laser beam, the second absorption coefficient less than the first absorption coefficient by about an order of magnitude.

2. The method according to claim 1, wherein the laser emits infrared radiation.

3. The method according to claim 2, wherein the wavelength of the laser is between about 1.2 and 15 microns.

4. The method according to claim 2, wherein the wavelength of the laser is between about 9 and 11 microns.

5. The method according to claim 2, wherein the wavelength of the laser is one of i) 9.3, ii) 9.6 and iii) 10.6 microns.

6. The method according to claim 1, wherein the layer is a plurality of layers and the second absorption coefficient of the substrate is less than each respective absorption coefficient of the plurality of layers.

7. The method according to claim 6, wherein the plurality of layers includes one or more of i) a passivation layer, ii) a polyimide layer, iii) a silicon oxide compound, iv) a silicon nitride compound, v) a dielectric layer, vi) aluminum and vii) copper.

8. The method according to claim 1, further comprising the step of:

e) dicing the substrate along the first set and second set of scribe lines to form a plurality of dice.

9. The method according to claim 8, wherein said step (e) further comprises the steps of:

(e1) sawing the substrate along the first set of scribe lines with a dicing saw to form a respective first set of kerfs;

(e2) sawing the substrate along the second set of scribe lines with the dicing saw to form a respective second set of kerfs.

10. The method according to claim 9, wherein a width of the laser scribe lines is greater than that of the saw blade kerfs.

11. The method according to claim 1, wherein each one of said first set of scribe lines is substantially parallel to one another, and each one of said second set of scribe lines is substantially parallel to one another.

12. The method according to claim 1, wherein the laser beam is formed by a CO2 laser.

13. The method according to claim 1, wherein the scribe lines have a depth equal to a depth of the layer.

14. The method according to claim 1, wherein the scribe lines have a depth no greater than a depth of the layer.

15. The method according to claim 1, wherein the substrate is silicon and the layer over the substrate is other than silicon.

16. The method according to claim 1, wherein the second absorption coefficient is less than the first absorption coefficient by at least an order of magnitude.

17. A method for dicing a semiconductor substrate comprising the steps of:

(a) aiming a laser beam having a wavelength between about 1.2 and 15 microns at a layer placed over a top surface of the substrate, the layer having a first absorption coefficient relative to the wavelength of the laser beam;

(b) absorbing energy from the laser beam into the layer based on the first absorption coefficient;

(c) forming at first set of scribe lines in a first direction in the layer by scanning the laser beam across the layer, the laser beam removing at least a portion of the layer; and (d) forming a second set of scribe lines in a second direction in the layer by scanning the laser beam across the layer and removing at least a portion of the layer with the laser beam, the second direction substantially orthogonal to the first direction, wherein the substrate has a second absorption coefficient relative to the wavelength of the laser beam, the second absorption coefficient less than the first absorption coefficient by about an order of magnitude.

18. The method according to claim 17, wherein the second absorption coefficient is less than the first absorption coefficient by at least an order of magnitude.

19. A method for dicing a semiconductor substrate comprising the steps of:

(a) aiming a laser beam at a layer placed over a top surface of the substrate;

(b) absorbing energy from the laser beam into only the layer;

(c) forming at first set of scribe lines in a first direction in the layer by scanning the laser beam across the layer, the laser beam removing at least a portion of the layer; and (d) forming a second set of scribe lines in a second direction in the layer by scanning the laser beam across the layer and removing at least a portion of the layer with the laser, the second direction substantially orthogonal to the first direction, wherein the layer has a first absorption coefficient and the substrate has a second absorption coefficient relative to a wavelength from the laser beam, the first absorption coefficient greater than the second absorption coefficient.

20. The method according to claim 19, wherein the first absorption coefficient is greater than the second absorption coefficient by at least an order of magnitude.

21. A method for dicing a semiconductor substrate using a laser and a dicing saw, the method comprising the steps of:

(a) aiming the laser at a layer placed over a top surface of the substrate;

(b) absorbing energy from the laser into the layer;

(c) forming at first set of scribe lines in a first direction in the layer by scanning the laser across the layer, the laser removing at least a portion of the layer;

(d) forming a second set of scribe lines in a second direction in the layer by scanning the laser across the layer and removing at least a portion of the layer with the laser, the second direction substantially orthogonal to the first direction;

(e) cutting a first set of kerfs in the substrate with the dicing saw along the first set of scribe lines; and (f) cutting a second set of kerfs in the substrate with the dicing saw along the second set of scribe lines, wherein the layer has a first absorption coefficient and the substrate has a second absorption coefficient relative to a wavelength of the laser beam, the first absorption coefficient greater than the second absorption coefficient by about an order of an order of magnitude, and the first set of kerfs and said second set of kerfs form a plurality of dice from the substrate.

22. The method according to claim 1, wherein the first absorption coefficient is greater than the second absorption coefficient by at least an order of magnitude.

23. A method for dicing a semiconductor substrate using a laser and a dicing saw, the method comprising the steps of:

(a) aiming the laser at a layer placed over a top surface of the substrate;

(b) absorbing energy from the laser into the layer;

(c) forming a first scribe line in a first direction in the layer by scanning the laser across the layer, the laser removing at least a portion of the layer;

(d) cutting a first kerf in the substrate with the dicing saw along the first scribe line;

(e) forming a further first scribe line in the first direction over the substrate, the further scribe line substantially parallel to the first scribe line;

(f) cutting a further first kerf in the substrate with the dicing saw along the further first scribe line;

(g) repeating steps (e) and (f) in the first direction until the entire substrate is scribed and cut;

(h) forming a second scribe line in a second direction in the layer by scanning the laser across the layer and removing at least a portion of the layer, the second direction substantially orthogonal to the first direction;

(i) cutting a second kerf in the substrate with the dicing saw along the second scribe line;

(j) forming a further second scribe line in the second direction on the substrate, the further second scribe line substantially parallel to the second scribe line;

(k) cutting a further second kerf in the substrate with the dicing saw along the further second scribe line; and (l) repeating steps (j) and (k) in the second direction until the entire substrate is scribed and cut;

wherein the layer has a first absorption coefficient and the substrate has a second absorption coefficient relative to a wavelength of the laser beam, the first absorption coefficient greater than the second absorption coefficient by about an order of magnitude, and the first kerf, the further first kerfs, the second kerf and the further second kerfs form a plurality of dice from the substrate.

24. The method according to claim 23, wherein the first absorption coefficient is greater than the second absorption coefficient by at least an order of magnitude.

* * * * *

UNITED STATES PATENT AND TRADEMARK OFFICE
CERTIFICATE OF CORRECTION

PATENT NO. : 6,555,447 B2
DATED : April 29, 2003
INVENTOR(S) : Ilan Weisshaus et al.

It is certified that error appears in the above-identified patent and that said Letters Patent is hereby corrected as shown below:

<u>Title page,</u>
Item [75], Inventors, "Ilan Weishauss" should read -- Ilan Weisshaus. --

Signed and Sealed this

Twenty-first Day of October, 2003

JAMES E. ROGAN
*Director of the United States Patent and Trademark Office*